US005539696A

United States Patent [19]
Patel

[11] Patent Number: 5,539,696
[45] Date of Patent: Jul. 23, 1996

[54] METHOD AND APPARATUS FOR WRITING DATA IN A SYNCHRONOUS MEMORY HAVING COLUMN INDEPENDENT SECTIONS AND A METHOD AND APPARATUS FOR PERFORMING WRITE MASK OPERATIONS

[76] Inventor: Vipul C. Patel, 16414 Clover Lodge Ct., Sugar Land, Tex. 77478

[21] Appl. No.: 466,526

[22] Filed: Jun. 6, 1995

Related U.S. Application Data

[63] Continuation of Ser. No. 189,527, Jan. 31, 1994, abandoned.

[51] Int. Cl.$^6$ ..................................................... G11C 7/00
[52] U.S. Cl. ............... 365/189; 365/189.05; 365/230.03; 365/233
[58] Field of Search ......................... 365/189.01, 189.05, 365/230.03, 230.08, 233, 230.5

[56] References Cited

U.S. PATENT DOCUMENTS

| | | | |
|---|---|---|---|
| 3,895,360 | 7/1975 | Criccui et al. | 365/184 |
| 4,802,132 | 1/1989 | Ohsawa | 365/230.03 |
| 4,947,373 | 8/1990 | Yamaguchi et al. | 365/230.03 |
| 5,003,510 | 3/1991 | Kamisaki | 365/189.05 |
| 5,016,220 | 5/1991 | Yamagata | 365/230.03 |
| 5,077,693 | 12/1991 | Hardee et al. | 365/230 |
| 5,083,296 | 1/1992 | Hara et al. | 365/230 |
| 5,126,973 | 6/1992 | Gallia et al. | 365/230.03 |
| 5,136,546 | 8/1992 | Fukuda | 365/185 |
| 5,148,396 | 9/1992 | Nakada | 365/189.03 |
| 5,148,523 | 9/1992 | Harlin et al. | 365/189.05 |
| 5,315,560 | 5/1994 | Nishimoto et al. | 365/189.05 |
| 5,384,745 | 1/1995 | Konishi et al. | 365/221 |

OTHER PUBLICATIONS

Reese, Ed and Eddy Huang, *A Sub–10nS Cache SRAM for High Peformance 32 Bit Microprocessors*, IEEE, 1990 Cust. IC confr., pp. 24.2.1–24.2.4.

Wilson, Ron, *Will the Search for the Ideal Memory Architecture Ever End?*, Computer Design, Jul. 1, 1990, pp. 78–99.
Hochstedler, Charles, *Self–Timed SRAMs Pace High–Speed ECL Processors*, Semiconductor Memories, 1990, pp. 4–10.
Lineback, J. Robert, *System Snags Shouldn't Slow the Boom in Fast Static RAMS*, Electronics, Jul. 23, 1987, pp. 60–62.
Triad Semiconductors Inc., *Static RAMs have on–chip address and Data Latches for Pipelining*, EDN, Dec. 8, 198, p. 116.
Cole, Bernard C., *Motorola's Radical SRAM Design Speeds Systems 40*, Electronics, Jul. 23, 1987, pp. 66–68.
Iqbal, Mohammad Shakaib, *Internally timed RAMs Build Fast Writable Control Stores*, Electronic Design, Aug. 25, 1988, pp. 93–96.
Leibson, Steven, SRAMs' *On–Chip Address and data Ltches Boost Throughput in Pipelined Systems*, EDN, Oct. 13, 1988, pp. 102–103.
Gallant, John, *Special–feature SRAMs*, EDN, Jun. 20, 1991, pp. 104–112.
Weber, Samuel, *Specialty SRAMs Are Filling the Speed Gap*, Electronics, May 1990, pp. 85–87.

*Primary Examiner*—Tan T. Nguygen

[57] ABSTRACT

A synchronous memory device is provided in which a timing and control circuit (28) receives timing and control inputs. A row address buffer (38) and row decoders (40 and 42) operate to enable rows in plural memory sections (30, 32, 34, and 36). Column decoders (58, 60, 62, and 64) operate to enable columns in each of the memory sections (respectively, 32, 36, 30 and 34). The column decoders (58, 60, 62, and 64) decode addresses received from counters (respectively 52, 54, 48, and 50), an adder (46), and a latch (56). Counters (48, 50, 52, and 54) and adder (46) generate column addresses for each memory section based on a starting address, thereby allowing for internal operation at less than the external system frequency. Furthermore, an input buffer (100) is provided that allows data input to the memory device to be received at the system frequency. Once data for each memory section has been received, a substantially simultaneous write operation is performed to each unmasked memory section.

17 Claims, 4 Drawing Sheets

METHOD AND APPARATUS FOR WRITING DATA IN A SYNCHRONOUS MEMORY HAVING COLUMN INDEPENDENT SECTIONS AND A METHOD AND APPARATUS FOR PERFORMING WRITE MASK OPERATIONS

This application is a continuation of application Ser. No 08/189,527, filed Jan. 31, 1994 now abandoned.

CROSS REFERENCES TO RELATED APPLICATIONS

This application is related to the following copending applications, all assigned to Texas Instruments Incorporated, and which are herein incorporated by reference: U.S. patent application Ser. No. 08/189,223, filed Jan. 31, 1994 pending, entitled "A CLOCK CONTROL CIRCUIT ARRANGEMENT", Attorney Docket No. TI-18272; U.S. patent application Ser. No. 08/189,345, filed Jan. 31, 1994 pending, entitled "METHOD AND APPARATUS FOR SYNCHRONOUS MEMORY ACCESS WITH SEPARATE MEMORY BANKS AND WITH MEMORY BANKS DIVIDED INTO COLUMN INDEPENDENT SECTIONS", Attorney Docket No. 18275; U.S. patent application Ser. No. 08/189,371, filed Jan. 31, 1994, entitled "METHOD AND APPARATUS FOR RECONFIGURING A SYNCHRONOUS MEMORY DEVICE AS AN ASYNCHRONOUS MEMORY DEVICE", Attorney Docket No. TI-18276; U.S. patent application Ser. No. 08/189,539, filed Jan. 31, 1994 now U.S. Pat. No. 5,450,364, entitled "METHOD AND APPARATUS FOR PRODUCTION TESTING OF SELF-REFRESH OPERATIONS AND A PARTICULAR APPLICATION TO SYNCHRONOUS MEMORY DEVICES", Attorney Docket No. TI-18277; U.S. patent application Ser. No. 08/189,538, filed Jan. 31, 1994 now U.S. Pat. No. 5,386,385, entitled "METHOD AND APPARATUS FOR PREVENTING INVALID OPERATING MODES AND AN APPLICATION TO SYNCHRONOUS MEMORY DEVICES", Attorney Docket No. TI-18291.

TECHNICAL FIELD OF THE INVENTION

This invention relates generally to the field of electronic devices, and more particularly to a method and apparatus for writing data in a synchronous memory and a method and apparatus for performing mask operations.

BACKGROUND OF THE INVENTION

The basic architecture of most data processing systems today includes a digital processor and random access memory. For economic reasons, the random access memory ("RAM") is often dynamic random access memory ("DRAM").

Typical operating frequencies for asynchronous DRAMs are in the range of 33 Mhz. For system clock rates above this range, the DRAM becomes a bottleneck that forces the processor and other components to wait for memory access. The same problem exists for more expensive memories as well, such as static random access memory ("SRAM"), electrically erasable programmable read-only memory ("EEPROM"), other programmable read-only memory ("PROM"), and read-only memory ("ROM").

Recently, synchronous dynamic random access memories ("SDRAM") have been proposed to better take advantage of inherent DRAM bandwidth. With synchronous DRAMs, data is clocked in and out of the memory device at relatively high rates. For example, synchronous DRAMs that use a pipeline architecture may be capable of running at speeds of 100 Mhz. However, the pipeline approach presents significant limitations that may prevent operation at speeds greater than 100 Mhz. With the pipeline approach, the internal access path is divided into stages, and each stage is updated with new data on every clock edge. Once the first data bit (or group of bits) is accessed, the remaining bits can be accessed every clock cycle. However, the speed of each write access is limited by the time it takes to decode column addresses. Presently, this operation takes approximately 12–15 nanoseconds, and thus the pipeline approach may not be capable of operating at speeds greater than 100 Mhz.

Moreover, high speed internal operation is often difficult and expensive in any synchronous design, because of complex timing requirements and inherent operating speed limitations of various components, such as sense amps and decoding circuitry.

SUMMARY OF THE INVENTION

Therefore, a need has arisen for a synchronous memory that is capable of operating at high system speed, for example, up to and greater than 100 Mhz.

In accordance with the teachings of the present invention, a method and apparatus for writing to a synchronous memory having column independent memory sections, and a method and apparatus for performing mask write operations are provided which substantially eliminate or reduce disadvantages and problems associated with prior synchronous memories.

In particular, a synchronous memory device for storing data is provided which includes a timing and control circuit operable to receive address and control inputs, one of the control inputs being a system clock operating at a system frequency. The synchronous memory device also includes a memory bank divided into a plurality of memory sections, each of the memory sections including an array of memory cells arranged in rows and columns. A row decoder is provided for enabling rows in each of the memory sections. Likewise, column decoder is provided for synchronously enabling columns in each of the memory sections substantially simultaneously. An input buffer is also provided to separately latch input data for each of the memory sections in synchronism with a system frequency.

In a particular embodiment, the input buffer includes a plurality of sets of latches, one each of the sets of latches associated with a respective memory section. Furthermore, a write latch control circuit is provided for controlling these sets of latches such that each set latches the data to be written to that set's respective memory section.

A method of writing data to a synchronous memory device is also provided, in which address and control inputs are received, one of the controller inputs being a system clock operating at a system frequency. In response to the address and control inputs, predetermined rows in a plurality of memory sections are enabled. Furthermore, predetermined columns are synchronously enabled in each of the plurality of memory sections substantially simultaneously. Data to be written to the memory device is received in synchronism with a system frequency, and written substantially simultaneously to the memory sections after data has been received for each of the memory sections.

Furthermore, a method is provided in which data to be written to the memory device is received in a plurality of sets of latches, one each of the sets of latches associated with a respective memory section. To latch in the input data, each of the sets of latches are opened for the data to be written to a first memory section. The set of latches associated with a first memory section is closed after receiving data for the first memory section and before data for a second memory section is received. The set of latches associated with the second memory section is closed after receiving data for the second memory section. Thereafter, sets of latches are successively closed after data for each associated memory section is received.

Also disclosed is a synchronous memory device having write mask capabilities in which a memory bank is divided into a plurality of memory sections. A write mask circuit is provided to mask the writing of data in response to a mask control input. The write mask circuit includes circuitry responsive to the mask control input and a section select signal, the section select signal indicating which section is to be masked, such that writing is prevented to the section to be masked upon assertion of the mask control input.

Also disclosed is a method of masking data to be written to a synchronous memory device, in which a plurality of memory sections are provided. In particular, a mask control signal is received synchronously with the data to be masked. The particular memory section that corresponds to the address of the data to be masked is selected, and writing of data to that memory section is prevented.

An important technical advantage of the present invention is the fact that an input buffer is provided that allows latching of data to be written to the memory device at the system frequency. With such an input buffer, high speed gapless writing of data to the memory device can be achieved.

Another important technical advantage of the present invention is the fact that the memory array is divided into column independent sections, and each of the memory sections are written to substantially simultaneously. With such an arrangement, the internal operating frequency of the memory device may be 1/n of the external operating frequency for n memory sections.

Another important technical advantage of the present invention is the fact that an input buffer is provided that allows latching of all data to be written to each of the memory sections during a substantially simultaneous write operation.

Another important advantage of the present invention is the fact that load control signals, which control latching of input data, are asserted together, and then deasserted at different times. By asserting them together, data can be latched as soon as it is received, rather than having to wait for generation of a load control signal each time new data is received.

Still another important technical advantage of the present invention is the fact that a method and apparatus is provided for masking writing of data to specified memory sections. The ability to mask the writing of data to certain memory sections provides for flexibility in a wide range of memory applications.

BRIEF DESCRIPTION OF THE DRAWINGS

For a more complete understanding of the present, invention and the advantages thereof, reference is now made to the following description taken in conjunction with the accompanying drawings in which like reference numbers indicate like features and wherein.

DETAILED DESCRIPTION OF THE INVENTION

The present invention will be discussed in connection with a memory device using DRAM cells. However, the concepts discussed herein apply as well to SRAM, EEPROM, PROM, ROM, and other memory devices.

Figure 1:
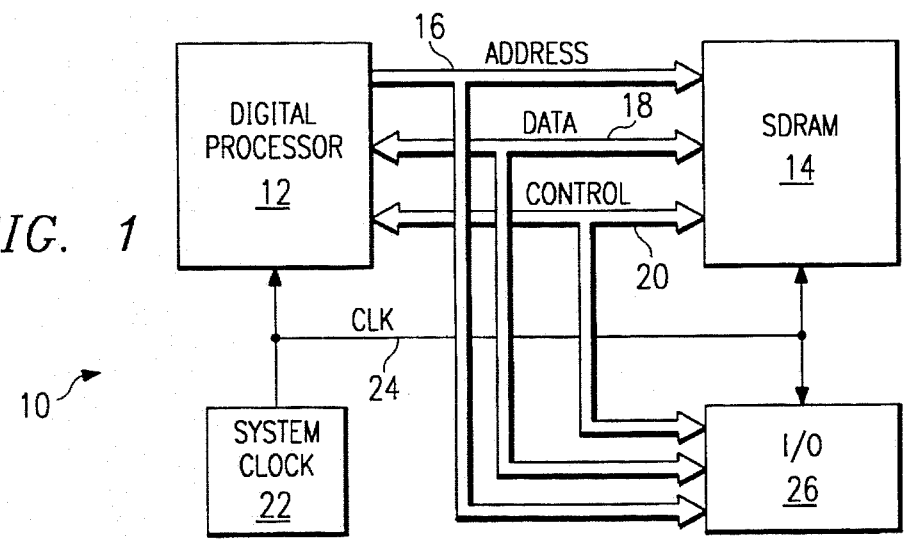
FIG. 1 illustrates a block diagram of a data processing system including a digital processor and synchronous DRAM.

FIG. 1 illustrates a block diagram of a data processing system 10. Data processing system 10 includes a digital processor 12 coupled to synchronous DRAM 14 through address bus 16, data bus 18, and control bus 20. System clock 22 is coupled to digital processor 12 and synchronous DRAM 14 through lead 24. Input/output ("I/O") device 26 is also coupled to digital processor 12 through buses 16, 18, and 20. I/O device 26 is also coupled to system clock 22 through lead 24. I/O device 26 may comprise, for example, a peripheral, such as a disk controller, or a device that allows communication with such a peripheral.

Data read from or written to synchronous DRAM 14 is transmitted across data bus 18. Reading and writing of data is controlled through control signals transmitted across control bus 20 and address locations transmitted across address bus 16. Typically, an address includes a row address and a column address. The address and control signals may be generated by digital processor 12 or by a memory controller. System clock 22 clocks the operation of digital processor 12 as well as synchronous DRAM 14. Address, data, and control signals, transmitted across buses 16, 18, and 20, respectively, are clocked into synchronous DRAM 14, and data is clocked out of synchronous DRAM 14. Therefore, the operation of synchronous DRAM 14 is synchronized with the system clock 22, and consequently with digital processor 12. It should be understood that the clock signal used to clock synchronous DRAM 14 may be derived from system clock 22. For example, digital processor 12 may output a clock signal that is derived from system clock 22 and which may be used to clock operation of synchronous DRAM 14.

The block diagram of FIG. 1 illustrates one possible configuration of a digital processor and a synchronous DRAM. With such a configuration, significant speed increases in memory access may be achieved over systems that use standard asynchronous DRAMs.

Figure 2:
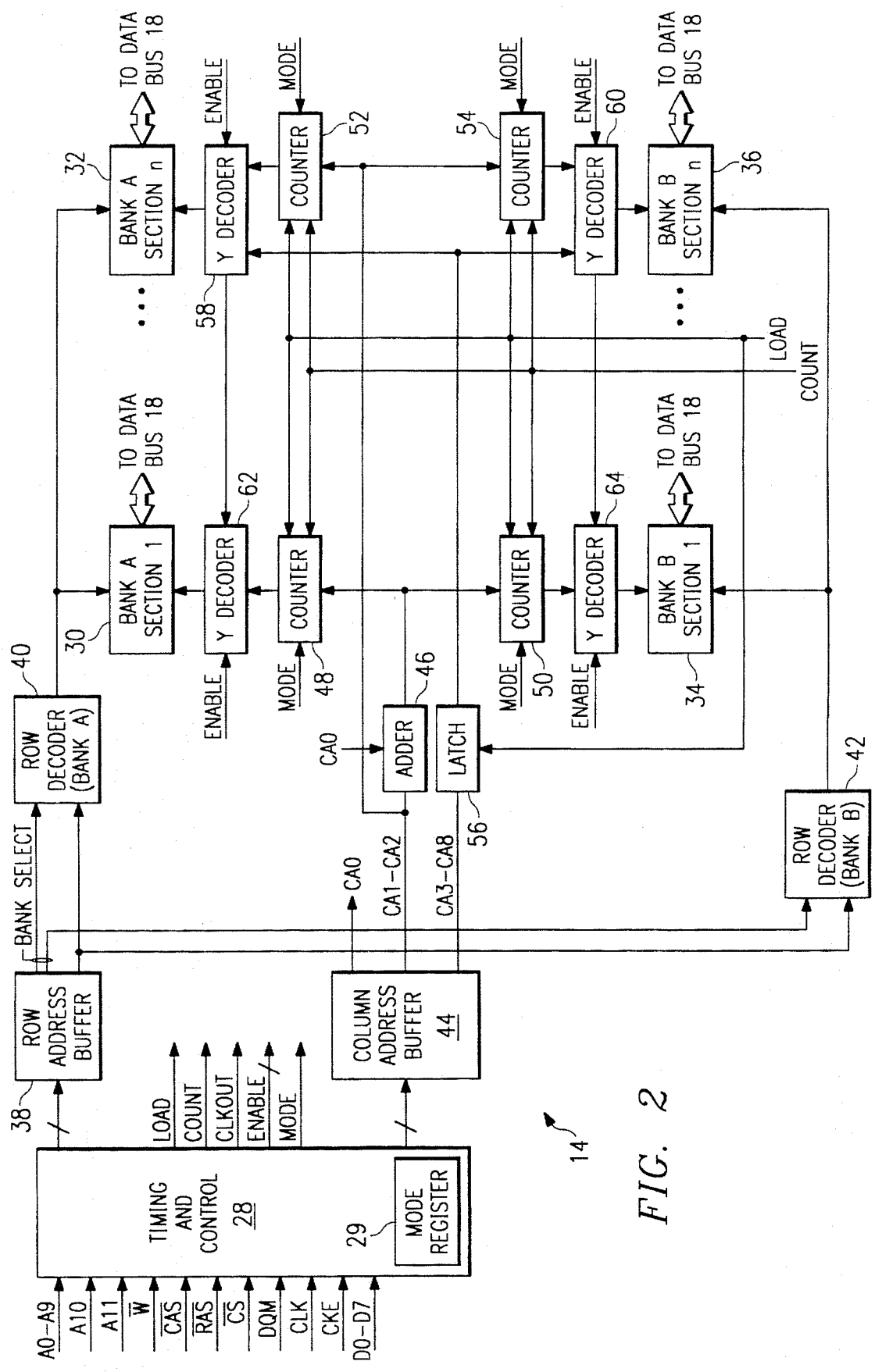
FIG. 2 illustrates a block diagram of a synchronous DRAM according to the teachings of the present invention.

FIG. 2 is a block diagram of synchronous DRAM 14 constructed according to the teachings of the present invention. Timing and control circuit 28 receives several inputs and generates several internal signals used to control and time the operation of synchronous DRAM 14. The inputs received by timing and control circuit 28 are listed in the following TABLE 1 and will be discussed in detail in connection with FIG. 2 and the remaining FIGURES.

TABLE 1

| INPUT | DESCRIPTION |
| --- | --- |
| A0–A10 | Address Inputs |
| A11 | Bank Select |
| $\overline{W}$ | Write Enable |
| $\overline{CAS}$ | Column Address Strobe |
| $\overline{RAS}$ | Row Address Strobe |
| $\overline{CS}$ | Chip Select |
| DQM | Data/Output Enable |
| CLK | System Clock |
| CKE | Clock Enable |
| D0–D7 | Data Inputs/Outputs |

The input signal CLK is the system clock operating at a system frequency. The system frequency is the cycle rate of the CLK signal. It should be understood that the particular input signals listed in the table above are exemplary only, and other signals may be used without departing from the intended scope of the present invention. For example, 12 address inputs are shown, which allow for receiving time multiplexed row and column addresses. However, a different number of address lines may be used to allow row and column addresses to be received together. Also, more or less address lines may be used in connection with a memory device with more or less memory space, or with a differently arranged memory array. Similarly, although 8 data lines are shown, more or less data lines may be used without departing from the intended scope of the present invention.

The synchronous DRAM 14 may be advantageously operated in a burst mode. In the burst mode, data is written-in or read-out at bursts of specified lengths. Within each burst, data is accessed each clock cycle, thus providing for high-speed synchronous operation. In a particular embodiment, the length of each burst sequence may be 1, 2, 4, or 8 accesses, although longer bursts may also be used without departing from the present invention. Therefore, as an example, with a device that inputs or outputs 8 bits at a time (1 byte at a time), 1, 2, 4, or 8 bytes can be read or written in a burst. In such a burst, each byte follows the last byte with no clock delays in between.

During a burst operation, data may be read or written serially or interleaved. Serial and interleaved refer to the order in which logical address locations are accessed. The burst length and burst type (i.e., whether serial or interleaved) are user programmable and stored in a mode register 29 within timing and control circuit 28. In a particular embodiment, the burst length and burst type data may be received across the address lines after entering a programming mode.

The array of memory cells within synchronous DRAM 14 is divided into two banks, bank A and bank B, as shown in FIG. 2. Furthermore, each memory bank is divided into n memory sections. As shown in FIG. 2, bank A is divided into sections 30 through 32. Likewise, bank B is divided into sections 34 through 36. The present invention will be discussed in connection with an embodiment in which each memory bank is divided into two sections, it being understood, however, that each memory bank may be divided into many more sections.

Within bank A, the columns of section 30 are independent from the columns of section 32. Therefore, each section may be separately accessed. Thus, sections 30 and 32 are said to be "column independent." Similarly, sections 34 and 36 of bank B are column independent. In a particular embodiment, for example, each section contains 4,096 rows and 1,024 columns, with two rows in each section being addressed by one row address, and four columns in each section being addressed by one column address. Thus, in this particular example, 8 bits are accessed from each section for one row and one column address. In this embodiment, twelve address bits are used for the row addresses, with one of these twelve bits selecting the memory bank, and the other eleven bits selecting two rows in each section. Furthermore, nine address bits are used for the column addresses, with one of these nine bits selecting the memory section, and the other eight bits selecting four columns in a section.

By dividing memory banks into n column independent sections, synchronous DRAM 14 may be operated internally at 1/n of the external system frequency, thus providing a significant advantage, since higher speed internal operation is more complex and expensive. For example, by dividing bank A into sections 30 and 32, data can be read out of each section at one-half the external frequency, with data being output from synchronous DRAM 14 at the rate of the external system clock. This is accomplished by accessing one memory location from one section and simultaneously accessing the next location from the other section. Thus, for example, for an external system frequency of 100 Mhz, each section must only be operated at 50 Mhz when two sections are used.

For an access to synchronous DRAM 14, whether it be a read or a write, the row address is received on the address inputs A0–A11 and latched in row address buffer 38 upon activation of the $\overline{RAS}$ signal and the rising edge of the CLK signal in the correct mode. The outputs of row address buffer 38 are internal row addresses. As discussed above, the row and column addresses may be time multiplexed, and in a particular example, the row address is received first. A BANK SELECT signal, which may correspond to row address input A11, is used to select between memory banks, through activation of the row decoders 40 and 42. Row decoder 40 decodes row addresses for bank A and row decoder 42 decodes row addresses for bank B. The BANK SELECT signal is generated by timing and control circuit 28. In a particular embodiment, the BANK SELECT signal is generated in response to activation of the $\overline{RAS}$ input signal and row address input A11.

Row decoder 40 decodes row addresses for section 30 and section 32 of bank A, and thus enables rows in each memory section. Likewise, row decoder 42 decodes row addresses for sections 34 and 36 of bank B. In a particular embodiment, each section of a particular bank is logically identical, and the same rows of each section are decoded simultaneously. It should be understood that separate row decoders may be used for each section of a particular bank without departing from the intended scope of the present invention.

The following is a discussion of the circuitry that controls column operations for each column independent section of a particular memory bank. This column decoder circuitry is operable to synchronously enable columns in each of the memory sections substantially simultaneously. A column address buffer 44 latches the column address received on the address inputs upon activation of the $\overline{CAS}$ signal and the rising edge of the CLK signal in the correct mode. The outputs of column address buffer 44 are internal column addresses. The internal column address bits will be referred to as CA0–CAn. For the particular embodiment shown, in which each memory bank is divided into two sections, column address bit CA0 is used to select between sections 30 and 32 of bank A and sections 34 and 36 of bank B. In embodiments where more sections are used, then more of the column address inputs would be needed to select between sections. For example, in an embodiment with four sections, two column address bits, CA0 and CA1, would be used to select between each section.

The low order column address bits CA1 and CA2 are input to an adder 46. Adder 46 adds either 1 or 0 to these low order bits, depending on column address bit CA0. If CA0=1, then adder 46 adds 1. If CA0=0, then adder 46 adds 0. The output of adder 46 is coupled to the inputs of counters 48 and 50. Counter 48 is associated with section 30 of bank A, and counter 50 is associated with section 34 of bank B. The low order column address bits CA1 and CA2 are also coupled directly to counters 52 and 54. Counter 52 is associated with section 32 of bank A and counter 54 is associated with section 36 of bank B. In the particular embodiment being discussed, the low order column address bits that are input to counters 48, 50, 52, and 54 either directly or through adder 46, are column address bits CA1 and CA2. These two bits, along with column address bit CA0, allow for burst counts of up to 8. With the burst length sequences to be discussed in connection with Tables 2–4, no carry or overflow bits are needed from adder 46.

Counters 48–54 synchronously load initial column address data upon activation of a LOAD signal. The LOAD signal is output by timing and control circuit 28. Thereafter, counters 48–54 count in either serial or interleaved fashion, depending upon the status of the MODE signal input to each counter, which is based on the burst type status stored in mode register 29. Counting is synchronously controlled by the COUNT signal, which is based on the burst data stored in the mode register 29. When active, the COUNT signal operates at 1/n the external system frequency.

The higher order column address bits CA3–CA8 are input to latch 56 and latched upon activation of the LOAD signal. The output of latch 56 is coupled to column decoders 58 and 60. Column decoder 58 is associated with section 32 of bank A and column decoder 60 is associated with section 36 of bank B. Column decoder 58 is coupled to column decoder 62 associated with section 30 of bank A. Similarly, column decoder 60 is coupled to column decoder 64 associated with section 34 of bank B. Each column decoder 58-64 is coupled to an ENABLE signal.

Column decoder 58 is coupled to the output of counter 52. Similarly, column decoder 60 is coupled to the output of counter 54. Column decoder 62 is coupled to the output of counter 48. Similarly, column decoder 64 is coupled to the output of counter 50.

In operation of the particular embodiment being discussed, the BANK SELECT signal activates a particular bank. The following discussion is in connection with activation of bank A, it being understood that bank B operates similarly. Row decoder 40 decodes rows in both sections 30 and 32. Upon activation of $\overline{CAS}$ and the rising edge of the CLK signal, column address buffer 44 latches the column address. This column address is the starting address, and will be used to generate all the other column addresses needed to complete a burst operation. To achieve high speed operation, the present invention accesses the starting address from the memory section to which the starting address corresponds, and simultaneously accesses the next address of the burst from the other section. This process repeats until the burst is complete.

By performing simultaneous accesses to more than one section, delays associated with decoding column addresses are experienced in parallel, rather than serially, and thus the column access time for the simultaneous accesses are hidden. Such accesses are typically about 30 nanoseconds long. Furthermore, by having two memory banks, delays associated with precharging bit lines are avoided by accessing alternately between banks, since one bank can precharge while the other bank is being accessed.

The column address bits CA1 and CA2 are loaded into counter 52. Those two bits, incremented by 0 or 1 by adder 46, are loaded into counter 48. Column decoders 58 and 62 decode the appropriate columns in response to the addresses received through counters 48 and 52 and latch 56. To reduce redundant circuitry, column decoder 58 decodes the high order address bits received from latch 56 and generates decoded high order factors both for itself and for column decoder 62. These high order factors are transmitted from decoder 58 to decoder 62.

Thus, counter 52 loads initial address bits, and counter 48 loads the same bits incremented by 0 or 1 by adder 46. If the starting column address is in section 30 (i.e., CA0=0), the adder 46 will add 0, since the next location (i.e., CA0=1) is in section 32, and CA1 and CA2 are unchanged. If the starting column address is in section 32 (i.e., CA0=1), then adder 46 will add 1, since the next location (i.e., CA0=0) is in section 30, and CA1 and CA2 are incremented by one. These initial address bits are loaded into counters 52 and 48 upon activation of the LOAD signal, and then decoded by column decoders 58 and 62 along with the bits output by latch 56. Latch 56 latches bits CA3–CA8 upon activation of the LOAD signal. The first two addresses of a burst are accessed in this manner.

On the next internal clock cycle, the COUNT signal is activated and counters 48 and 52 count according to the status of the MODE signal, thus outputting incremented column addresses in synchronism with the internal clock frequency, allowing for access to the next two addresses of the burst. Depending on the MODE signal, counters 48 and 52 will count in either serial or interleaved fashion. Counting continues in synchronism with the internal clock frequency until the burst operation is completed. The ENABLE signal will enable each column decoder 58 and 62 during either a read or write operation. Once the burst operation is completed, the column decoders and row decoders will be disabled, allowing the memory sections to pre-charge for the next operation.

The logical memory space of sections 30 and 32 is arranged such that successive memory locations alternate between section 30 and 32. For serial access, memory locations are ordered according to this logical arrangement. For interleaved access, memory locations are still ordered alternately from section 30 to section 32 and back again, but according to an interleave routine. The following TABLES 2–4 illustrate the internal column addresses generated by the adder 46 and the counters 48 and 52 for burst lengths of 2, 4, and 8, to access memory locations. It should be understood that both memory sections 30 and 32 are accessed simultaneously, and thus the first and second locations are accessed at once, as are the third and fourth, fifth and sixth, and seventh and eighth locations.

TABLE 2

Sequences for Burst Length of 2

|  | INTERNAL COLUMN ADDRESS CA0 | |
| --- | --- | --- |
|  | START | 2ND |
| Serial | 0 | 1 |
|  | 1 | 0 |
| Interleave | 0 | 1 |
|  | 1 | 0 |

TABLE 3

Sequences for Burst Length of 4

|  | INTERNAL COLUMN ADDRESS CA1, CA0 | | | |
| --- | --- | --- | --- | --- |
|  | START | 2ND | 3RD | 4TH |
| Serial | 00 | 01 | 10 | 11 |
|  | 01 | 10 | 11 | 00 |
|  | 10 | 11 | 00 | 01 |
|  | 11 | 00 | 01 | 10 |
| Interleave | 00 | 01 | 10 | 11 |
|  | 01 | 00 | 11 | 10 |
|  | 10 | 11 | 00 | 01 |
|  | 11 | 10 | 01 | 00 |

TABLE 4

Sequences for Burst Length of 8

INTERNAL COLUMN ADDRESS CA2, CA1, CA0

|  | START | 2ND | 3RD | 4TH | 5TH | 6TH | 7TH | 8TH |
| --- | --- | --- | --- | --- | --- | --- | --- | --- |
| Serial | 000 | 001 | 010 | 011 | 100 | 101 | 110 | 111 |
|  | 001 | 010 | 011 | 100 | 101 | 110 | 111 | 000 |
|  | 010 | 011 | 100 | 101 | 110 | 111 | 000 | 001 |
|  | 011 | 100 | 101 | 110 | 111 | 000 | 001 | 010 |
|  | 100 | 101 | 110 | 111 | 000 | 001 | 010 | 011 |
|  | 101 | 110 | 111 | 000 | 001 | 010 | 011 | 100 |
|  | 110 | 111 | 000 | 001 | 010 | 011 | 100 | 101 |
|  | 111 | 000 | 001 | 010 | 011 | 100 | 101 | 110 |
| Inter-leave | 000 | 001 | 010 | 011 | 100 | 101 | 110 | 111 |
|  | 001 | 000 | 011 | 010 | 101 | 100 | 111 | 110 |
|  | 010 | 011 | 000 | 001 | 110 | 111 | 100 | 101 |
|  | 011 | 010 | 001 | 000 | 111 | 110 | 101 | 100 |
|  | 100 | 101 | 110 | 111 | 000 | 001 | 010 | 011 |
|  | 101 | 100 | 111 | 110 | 001 | 000 | 011 | 010 |
|  | 110 | 111 | 100 | 101 | 010 | 011 | 000 | 001 |
|  | 111 | 110 | 101 | 100 | 011 | 010 | 001 | 000 |

As can be seen from these tables, data is ordered alternately between memory sections 30 and 32, regardless of burst type. The internal column address bits CA1 and CA2 shown in the tables are controlled by adder 46 and counters 48 and 52. The first two addresses accessed during any burst are determined by the start address and adder 46. All other addresses are determined by counters 48 and 52. The internal column address bit CA0 is used to determine which memory section contains the first accessed location of a burst operation. The counters 48–54 and adder 46 determine subsequent memory locations, and both sections are accessed simultaneously. Thus, CA0 is not changed until another burst operation is initiated. For clarity, the above TABLES 2–4 indicate CA0 changing, simply to illustrate the logical order of each accessed location.

In a particular embodiment, each column address accesses 8 bits, and 8 bits are output from each section each internal clock cycle. Thus, a total of 16 bits are output to the output buffers each internal clock cycle, which will be discussed.

The particular embodiment being discussed includes two sections for each memory bank. However, many more sections may be used as well. For an embodiment with n sections, n-1 adders would be included, with the nth memory section having no adder. The adders would add between 0 and 1 to the appropriate address bits, the results then being loaded into associated counters. Each of the n sections would have its own counter fed either directly from the appropriate column address lines or through an associated adder. The amount added by each adder would be determined by the starting address. For example, with the starting address in memory section x, with 1<x<n, then adders associated with memory sections x to n-1 would add zero, and adders associated with memory sections 1 to x-1 would add one. Zero is always added by the adder associated with the memory section containing the starting address. With n memory sections, n addresses of a burst would be accessed upon the initial load and then on each succeeding count. FIG. 2 illustrates n memory sections through use of the ". . . " symbol between sections.

Figure 3:
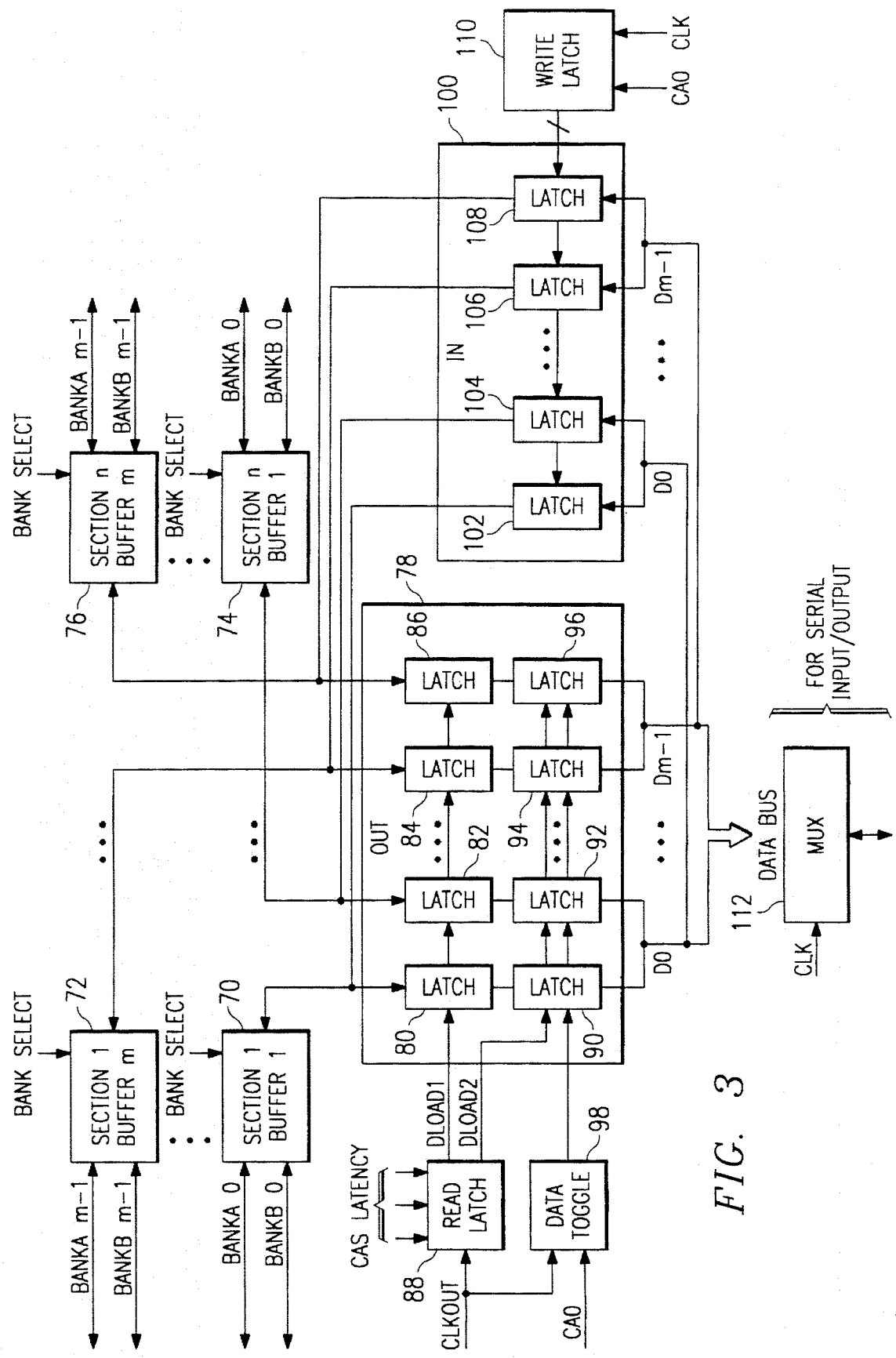
FIG. 3 illustrates I/O circuitry for a synchronous DRAM according to the teachings of the present invention.

FIG. 3 illustrates a block diagram of input/output circuitry for a synchronous DRAM constructed according to the teachings of the present invention. Each of the n sections into which the memory banks are divided include m buffers. Thus, buffers 70–72 are provided to receive output data and transmit input data to section 1 of banks A and B. Buffer 70 transmits internal data bit D0, while buffer 72 transmits data bit Dm-1, all for section 1. With respect to FIG. 2, buffers 70 and 72 would transmit data to and from sections 30 and 34 of banks A and B, respectively. Similarly, buffers 74 and 76 transmit data bits D0 and Dm-1 to section n of banks A and B. In the particular embodiment discussed in connection to FIG. 2, buffers 74 and 76 transmit and receive data to and from sections 32 and 36 of banks A and B. For the embodiment in which more than two sections per bank are used, one set of buffers would be provided for each section. Buffers 70–76 select between banks through the use of the BANK SELECT signal.

Data to be read from synchronous DRAM 14 is output through output buffer 78. The output buffer 78 is operable to substantially simultaneously receive data from the memory sections of a bank and to alternately output data from the memory sections in synchronism with the system frequency. Output buffer 78 is a two stage buffer, which allows data to be read out at the external clock frequency. Data from each of the buffers 70–76 is latched into the first latch stage of output buffer 78. This first latch stage includes one latch for each of the buffers 70–76. Thus, for m bits and memory banks divided into n sections, there are m times n latches in the first stage of the output buffer 78. In the particular example being discussed, in which there are 8 bits and two sections per memory bank, the first stage of output buffer 78 includes 16 latches, latches 80–86. In particular, latch 80 receives data from buffer 70, and latch 82 receives data from buffer 74. Latch 84 receives data from buffer 72, and latch 86 receives data from buffer 76.

Data to be read out is latched into latches 80–86 upon a DLOAD1 signal. DLOAD1 is generated by read latch control circuit 88. Read latch control circuit 88 clocks data out based on a CLKOUT signal generated by timing and control circuit 28. The frequency of the CLKOUT signal is equal to that of the external system clock frequency. The DLOAD1 signal, when active, operates at ½ the external system clock frequency, for an embodiment with two sections per memory bank. The DLOAD1 signal is also generated based on CAS latency data which is stored as a code in mode register 29. CAS latency is user programmable and determines the number of clock cycles that occur between assertion of the $\overline{CAS}$ signal and valid output data. Read latch circuit 88 also generates the DLOAD2 signal which latches data from the first latch stage of output buffer 78 into the second latch stage. The second latch stage of output buffer 78 includes latches 90–96. The second latch stage includes one latch per latch in the first stage.

A data toggle circuit 98 selects the order that the latches 90–96 will output data onto the output data lines. For the particular embodiment being discussed, in which each memory bank is divided into two sections, data toggle circuit 98 alternately selects between latches associated with each of the two sections. Thus, data toggle circuit 98 outputs its toggle signal based on the CLKOUT signal and a single input, bit CA0 of the column address. CA0 selects the order that the data from the two sections 30 and 32 of bank A and sections 34 and 36 of bank B will be output. Data toggle circuit 98 will cause the data in the second latch stage associated with each memory section to be alternately output. Once all the data has been output, the DLOAD2 signal will be asserted to load new data from the first latch stage. In the embodiment in which each memory bank is divided into more than two sections, then data toggle circuit 98 would receive sufficient input signals to select between each section for outputting data. Thus, the output buffer 78 receives data substantially simultaneously from each of the memory sections of a memory bank, and alternately outputs data from each of these memory sections in synchronism with the system frequency.

Data to be input to synchronous DRAM 14 is input through input buffer 100. Input buffer 100 includes latches 102–108. The number of latches in input buffer 100 is the same as the number of latches in either stage of output buffer 78. Write latch circuit 110 receives a clock signal at the system frequency and column address bit CA0 to choose which of the latches 102–108 receives the data being received on the data bus at a particular time.

A multiplexer 112 may also be included at the output stage to clock data in or out one bit at a time, in serial fashion, for appropriate applications, such as video applications.

Figure 4:
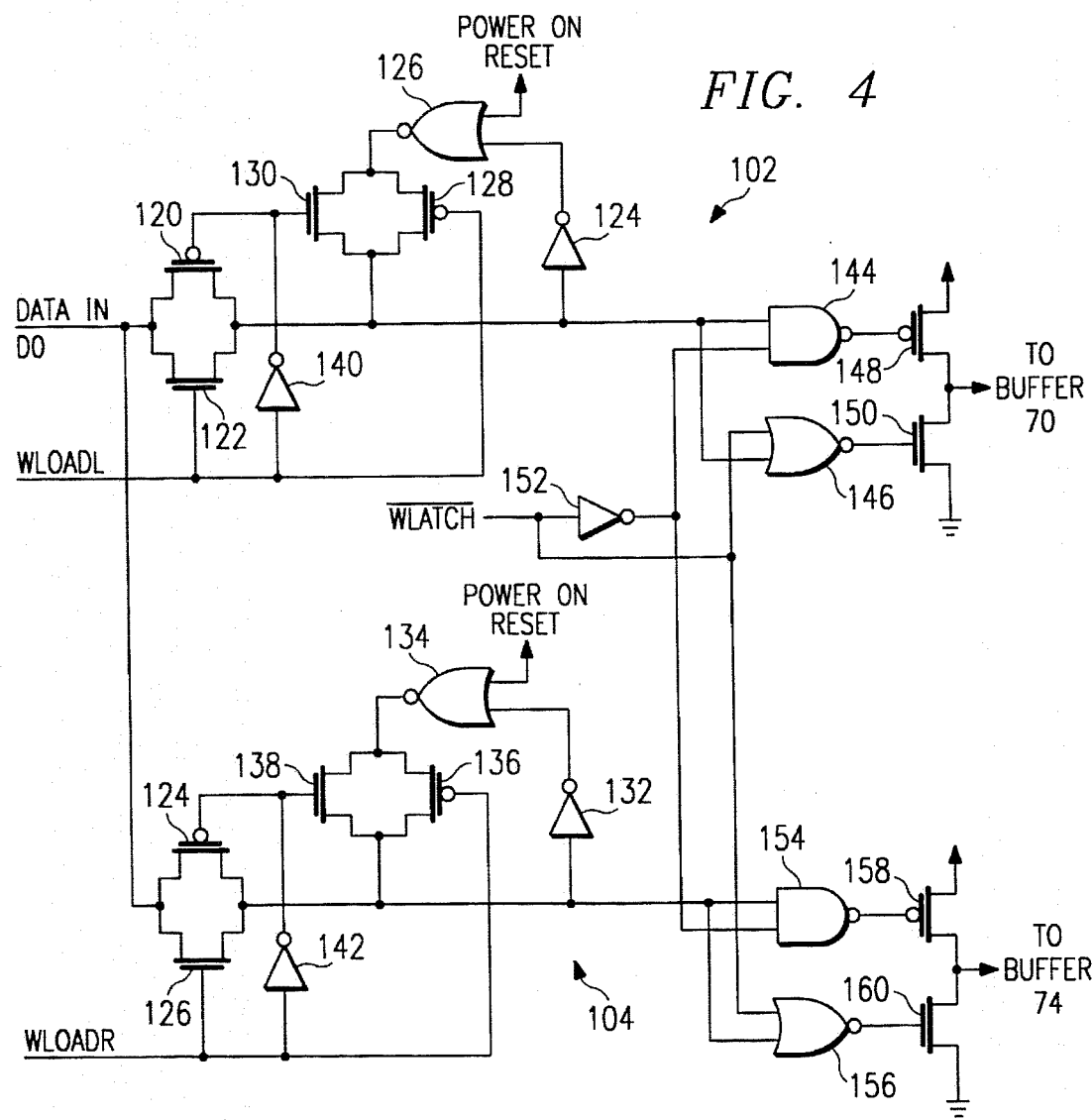
FIG. 4 illustrates input latch circuitry according to the technique of the present invention.

FIG. 4 illustrates exemplary input latch circuitry within input buffer 100 of FIG. 3 according to the teachings of the present invention. This circuitry is operable to separately latch input data for each of the memory sections in synchronism with the system frequency. Once data for each memory section of a bank is received, the input data is substantially simultaneously written to the memory sections. In general, one set of latches is provided for each memory section. Each set includes one latch for each data input line. The particular circuitry shown in FIG. 4 corresponds to latches 102 and 104 in FIG. 3, it being understood that the circuit of FIG. 4 is repeated for all of the latches within input buffer 100.

Data received from the external data bus is input to latch 102 through transistors 120 and 122. Likewise, the data is transmitted into latch 104 through transistors 124 and 126. Data is latched in latch 102 through inverter 124, NOR-Gate 126, and transistors 128 and 130. Likewise, data is latched in latch 104 through inverter 132, NOR-Gate 134, and transistors 136 and 138. Latch 102 is controlled through a load control signal, the WLOADL signal. The WLOADL signal is coupled to the gate of transistor 122 and the gate of transistor 120, through inverter 140. Similarly, a WLOADR load control signal controls latching of data into latch 104. The WLOADR signal is coupled to the gate of transistor 126 and to the gate of transistor 124 through inverter 142.

With the WLOADL signal high, data is latched into latch 102. If the WLOADL signal is low, then the latch 102 is closed. The operation of latch 104 is similarly controlled by the WLOADR signal. One each of the inputs of NOR-Gates 126 and 134 are coupled to a power on reset. The power on reset signal is normally a logical low signal. On power on, however, it is raised high to reset the input latches so that they are in a known state.

Data latched within latch 102 is output through NAND-Gate 144 and NOR-Gate 146. The output of NAND-Gate 144 is coupled to the gate of transistor 148. The output of NOR-Gate 146 is coupled to the gate of transistor 150. NAND-Gate 144 also receives an input through inverter 152 from a $\overline{WLATCH}$ signal. The control input signal $\overline{W}$ is latched to form the $\overline{WLATCH}$ signal. The $\overline{WLATCH}$ signal is directly input to the input of NOR-Gate 146, enables data input on assertion of the $\overline{W}$ signal. Similarly, latch 104 is output through NAND-Gate 154 and NOR-Gate 156. The output of NAND-Gate 154 is coupled to the gate of transistor 158. The output of NOR-Gate 156 is coupled to the gate of transistor 160. And input of NAND-Gate 154 is also coupled to the output of inverter 152. An input of NOR-Gate 156 is coupled to the $\overline{WLATCH}$ signal.

Figure 5:
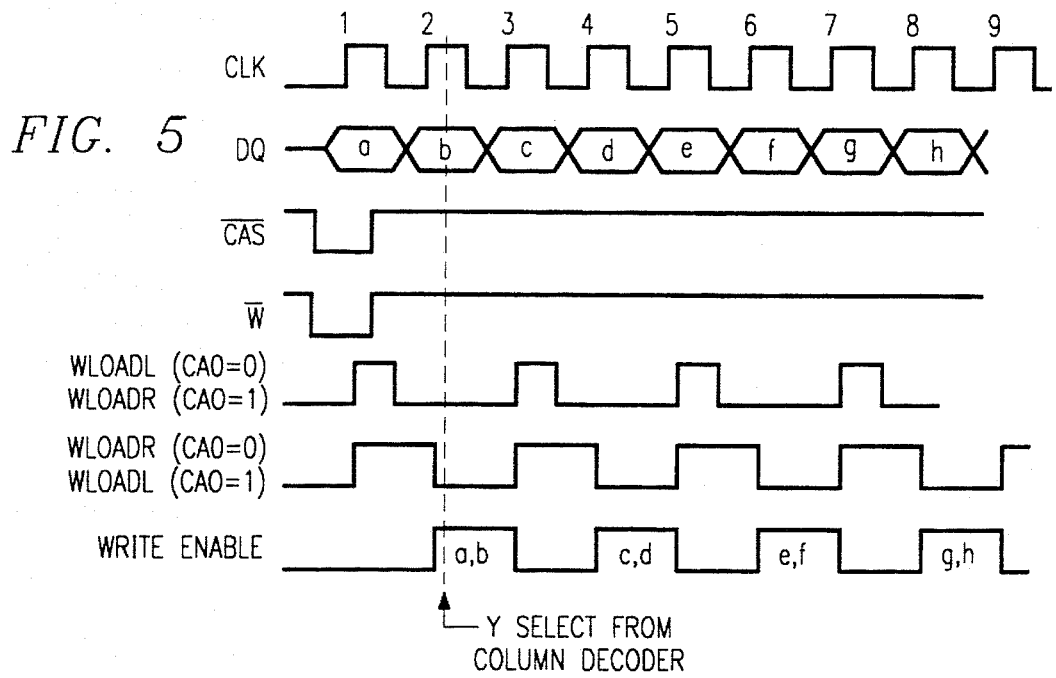
FIG. 5 is a timing diagram illustrating operation of the circuit of FIG. 4.

The operation of the circuit of FIG. 4 is illustrated by the timing diagram of FIG. 5. The WLOADL and WLOADR signals are generated by the write latch circuit 110 of FIG. 3. Both of the WLOADL and WLOADR signals are asserted after a write command, thus opening both latches. Thus, data a is latched into both latches 102 and 104. Before data b is received on the data input bus, the WLOADL signal is deasserted, and thus latch 102 is closed and will not receive data b. The WLOADR signal, however, remains asserted, and the data b is latched into latch 104. Latch 104 is then closed. Thus, two sets of data, data a and data b, are latched in two clock cycles. This data is passed through to buffers 70 and 74. Upon a write enable signal, as shown in FIG. 5, the data a and b are written substantially simultaneously into sections 30 and 32 of bank A.

The WLOADL and WLOADR signals are generated by write latch circuit 110 shown in FIG. 3. The CA0 signal determines which of latches 102 and 104 latches which data received from the input data bus. For example, if CA0=0, the WLOADL signal will rise and fall as shown in FIG. 5, and latch 102 will latch in data a, c, e, and g. Likewise, the WLOADR signal will be asserted as shown in FIG. 5 such that latch 104 latches in data b, d, f and h. The particular example shown in FIG. 5 is for a burst length of 8. If CA0=1, then the WLOADL and WLOADR signals would be reversed, as also shown in FIG. 5. For embodiments with n memory sections, WLOADn signals are generated by write latch circuit 110 in response to an appropriate number of column address bits.

An important advantage of the present invention is the fact that the load control signals, in a particular embodiment the WLOADL and WLOADR signals, are asserted together, and then deasserted at different times. Because these signals are generated with reference to a clock edge, asserting them separately (e.g., on successive clock cycles) would cause a delay each time one is to be asserted, resulting from the time it takes to assert such signals, which is typically two to three nanoseconds. Such delays are significant at higher clock rates, such as 100 Mhz. By asserting them together, data can be latched as soon as it is received, rather than having to wait for generation of a load control signal each time new data is received.

By using the latch circuit of FIG. 4, another significant advantage results, since data may be received into synchronous DRAM 14 at the same time the write command (the $\overline{CAS}$ and $\overline{W}$ signals being asserted) is executed, without any clock cycles in between. If only one latch per data input line were used, then a delay would be required between data inputs. For example, a typical delay of 12 to 15 nanoseconds occurs between receiving a column address and then decoding that column address through column decoders, such as column decoders 58–64. Thus, for a clock cycle of 100 Mhz, this delay is more than one clock cycle. As shown in FIG. 5, the Y-select signal generated by a column decoder would not be generated until after the beginning of the second clock cycle, in the example of a 100 Mhz clock frequency. Therefore, if only one input latch were used, then the data a would have to remain in the latch until the Y-select signal was generated. Thus, data b could not be latched until the beginning of the third clock cycle. Consequently, a delay of one clock cycle would be required between data inputs.

With the present invention, however, one set of latches per memory section is used. Thus, in the specific embodiment illustrated, data a and data b are latched in and both written together into respective memory sections 30 and 32. Consequently, the present invention allows for gapless input of data for write operations.

With the particular embodiment being discussed, in which each memory bank is divided into two column independent sections, two input latches are provided for each of the eight data input lines (for an 8-bit example), and two bytes are written at once at ½ the external clock frequency. For embodiments where each memory bank is divided into n memory sections, n input latches would be provided for each data input line. Furthermore, n groups of data would be written substantially simultaneously to the n memory sections at 1/n the external system clock frequency. In such cases, all sets of latches will be opened while the first input data is received. The set of latches associated with the memory section to which the first input data is to be written will be closed before the second input data is received. The set of latches associated with the memory section to which the second data is to be written will remain open until the second data is received and will be closed before the third input data is received. This process continues until data for each memory section has been received. The data is then substantially simultaneously written to all the memory sections.

Figure 6:
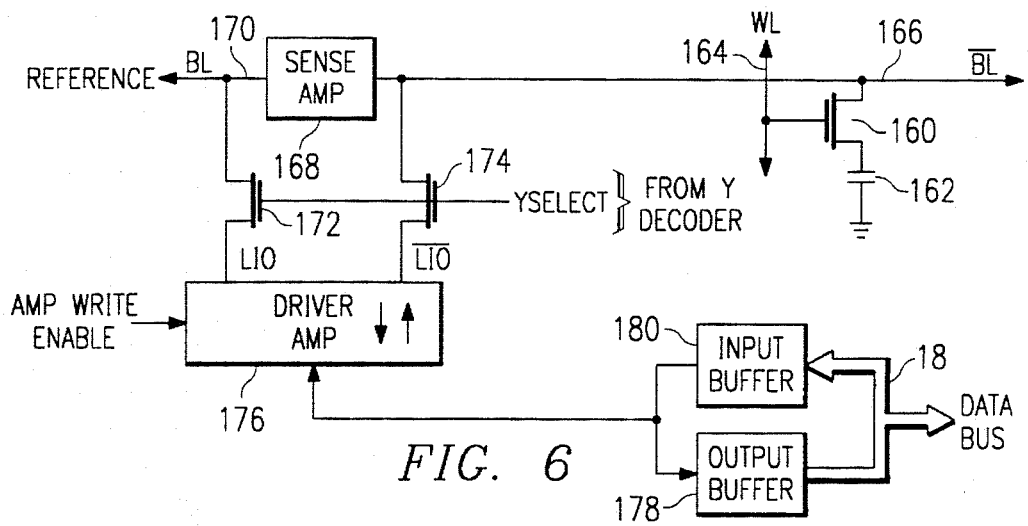
FIG. 6 illustrates a block diagram of a particular memory cell and I/O circuitry according to the teachings of the present invention.

FIG. 6 illustrates a block diagram of a typical memory cell and its connection to the input/output circuitry shown in FIG. 3. As shown in FIG. 6, a memory cell comprises a transistor 160 and a capacitor 162 for storing charge. The gate of transistor 160 is coupled to word line 164. Many other memory cells will also coupled to word line 164. Transistor 160, under the control of word line 164, transfers charge between capacitor 162 and bit line 166. Many other memory cells are also coupled to bit line 166 by different transistors controlled by different wordlines.

Once word line 164 is activated, sense amp 168 senses and amplifies charge differences between bit line 166 and reference bit line 170. Once the column decoder selects bit line 166, the Y-select signal is activated and pass gate transistors 172 and 174 are turned on, thereby allowing driver amp 176, on read operations, to output data to output buffer 178. Output buffer 178 corresponds to buffers 70–76 and 78 of FIG. 3. For write operations, data is received from the data bus into input buffer 180, which corresponds to buffers 70–6 and 100 of FIG. 3, and then transmitted from input buffer 180 to driver amp 176. Driver amp 176 then drives bit line 166 through pass gate transistor 174 to write the appropriate data into the memory cell. Driver amp 176 is a two-way driver and either drives a bit line or drives the output buffer depending upon whether a write or a read operation is requested. Driver amp 176 is enabled to write upon activation of an AMP WRITE ENABLE signal, to be discussed.

Figure 7:
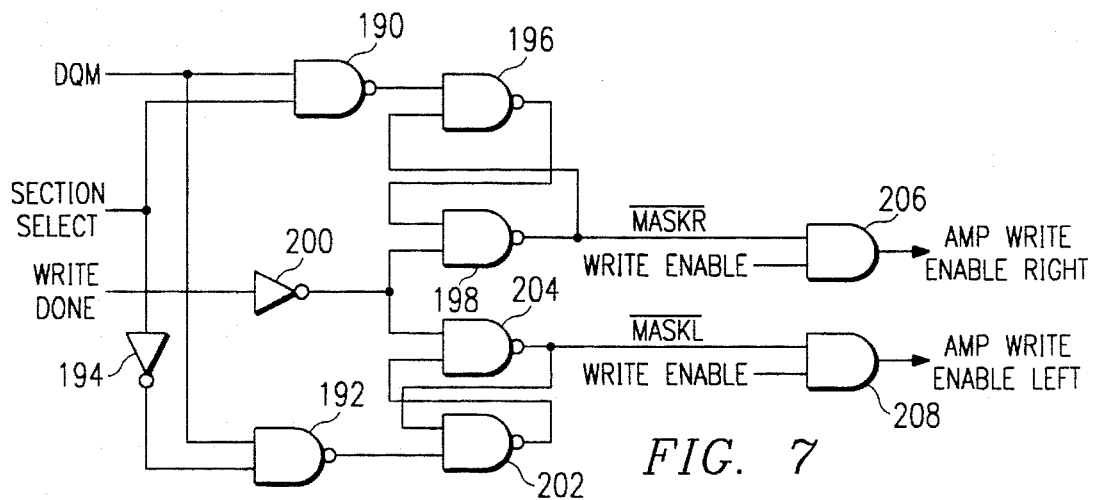
FIG. 7 illustrates a write mask circuit according to the techniques of the present invention.

FIG. 7 illustrates a circuit for implementing a write mask function. The write mask function allows the user, through use of the DQM signal, to mask the writing of certain data. This function is useful in any system where it is desirable to mask the writing of certain data. For example, in systems using a plurality of memory chips, it may be desirable to write bursts of data across the chips, such that the first data is written to one chip, the second data is written to another chip, and so on. In such systems, masking of the chips not to be written to is desirable.

FIG. 7 illustrates a particular embodiment of a circuit for implementing a mask function. The circuit of FIG. 7 comprises a flip-flop used to latch a signal which determines whether data is to be written or not. In particular, the DQM mask signal is input to two NAND-Gates, 190 and 192. NAND-Gate 190 also receives a SECTION SELECT signal input. NAND-Gate 192 receives the SECTION SELECT signal through an inverter 194. NAND-Gate 190 is coupled to the input of NAND-Gate 196. Another input of NAND-Gate 196 is coupled to the output of NAND-Gate 198. The output of NAND-Gate 196 is coupled to an input of NAND-Gate 198. Another input of NAND-Gate 198 is coupled through an inverter 200 to a WRITE DONE signal. NAND-Gates 196 and 198 form a flip-flop.

Similarly, the output of NAND-Gate 192 is coupled to an input of NAND-Gate 202. Another input of NAND-Gate 202 is coupled to the output of NAND-Gate 204. An input of NAND-Gate 204 is coupled to the output of NAND-Gate 202. Another input of NAND-Gate 204 is coupled to the output of inverter 200. NAND-Gates 202 and 204 form a flip-flop.

The output of the NAND-Gate 198 is a $\overline{MASKR}$ signal, which determines whether, in the particular embodiment being discussed, data can be written to section 32 and section 36 of banks A and B (the right sections). Similarly, the output of NAND-Gate 204 is a $\overline{MASKL}$ signal, which determines whether data can be written into, in the particular embodiment being discussed, sections 30 and 34 of banks A and B (the left sections). In particular, the $\overline{MASKR}$ signal is input to an AND-Gate 206. AND-Gate 206 also receives a WRITE ENABLE signal from timing and control circuit 28. The output of AND-Gate 206 is an AMP WRITE ENABLE RIGHT signal. The AMP WRITE ENABLE RIGHT signal enables driver amps, such as driver amp 176 shown in FIG. 6, for sections 32 and 36 of banks A and B, in the particular embodiment being discussed.

Similarly, the $\overline{MASKL}$ signal is input to AND-Gate 208. AND-Gate 208 also receives the WRITE ENABLE signal from timing and control circuit 28. The output of AND-Gate 208 is an AMP WRITE ENABLE LEFT signal, which enables driver amps, such as driver amp 176 shown in FIG. 6. The AMP WRITE ENABLE LEFT signal enables driver amps for, in the particular embodiment being discussed, sections 30 and 34 banks A and B.

In operation, the DQM mask signal is input simultaneously with the address of the data to be masked. If no data is to be masked, then the DQM signal is low, and the $\overline{MASKR}$ and $\overline{MASKL}$ signals will be high. Thus, the AMP WRITE ENABLE RIGHT and the AMP WRITE ENABLE LEFT signals will follow the WRITE ENABLE signal generated by timing and control circuit 28.

If data is to masked, however, then the DQM signal is brought high. The SECTION SELECT signal chooses which memory section is to be masked. In the two memory section embodiment, SECTION SELECT will be 0 for the left memory sections and 1 for the right memory sections. If SECTION SELECT is 0, then the $\overline{\text{MASKL}}$ will be low (active), thus providing a mask function. The output of AND-Gate 208 will be low, and thus the amps corresponding to the left memory sections will not be enabled. With SECTION SELECT=0, the $\overline{\text{MASKR}}$ signal will be high, and the right memory sections will be enabled in accordance with the WRITE ENABLE signal.

If SECTION SELECT=1 while the DQM signal is asserted for masking, then the $\overline{\text{MASKR}}$ signal will be active, thus preventing enabling of the right memory sections. Furthermore, the $\overline{\text{MASKL}}$ signal will be high, thus allowing enabling of the left memory sections. Upon completion of a write operation to each memory section, timing and control circuit 28 generates a WRITE DONE signal, which resets the $\overline{\text{MASKR}}$ and $\overline{\text{MASKL}}$ signals to the non-mask condition.

In embodiments with the memory banks divided into n sections, each section is masked by generating a $\overline{\text{MASKn}}$ signal similarly to the $\overline{\text{MASKL}}$ and $\overline{\text{MASKR}}$ signals. The SECTION SELECT signal is generated by decoding circuitry that decodes the addresses to choose the section to be masked.

Furthermore, the present invention has been discussed in connection with specific embodiments, in particular circuit arrangements have been provided. It should be understood that other circuit components and arrangements may be used to implement the present invention without departing from its intended scope.

The present invention has been discussed in connection with row and column addresses being received separately. It should be understood that more address lines could be used such that both row and column addresses are received simultaneously.

Although the present invention has been described in detail it should be understood that various changes, substitutions, and alterations can be made without departing from the spirit and scope of the invention as defined by the appended claims.

What is claimed is:

1. A synchronous memory device for storing data, said memory device comprising:
    a timing and control circuit operable to receive address and control inputs and to generate internal control signals, one of said control inputs comprising a system clock signal operating at a system clock frequency;
    a memory bank including a plurality of memory sections, each of said memory sections including an array of memory cells arranged in rows and columns;
    a row decoder coupled to said timing and control circuit and operable to enable rows in each of said memory sections;
    a column decoder coupled to said timing and control circuit and operable to synchronously enable columns in each of said memory sections substantially simultaneously; and
    an input buffer coupled to said memory bank, said input buffer operable to receive input data groups at said system clock frequency and to separately latch input data for each of said memory sections in synchronism with said system clock frequency, wherein said input buffer includes a plurality of sets of latches, one each of said sets associated with a respective memory section.

2. The synchronous memory of device of claim 1, wherein said memory bank comprises an array of dynamic random access memory cells.

3. The synchronous memory device of claim 1, wherein said memory bank includes two memory sections.

4. The synchronous memory device of claim 1, wherein each of said sets of latches includes one latch for each data input line coupled to the memory device.

5. The synchronous memory device of claim 1, wherein said timing and control circuit enables substantially simultaneous writing of data groups into each of said memory sections after each of said sets of latches have latched data to be written.

6. The synchronous memory device of claim 1, and further comprising a write latch control circuit operable to control said sets of latches such that each set latches that data to be written to said set's respective memory section.

7. The synchronous memory device of claim 6, wherein said write latch control circuit further comprises:
    circuitry operable to open each of said sets of latches for the data group to be written to a first memory section;
    circuitry operable to close the set of latches associated with said first memory section after receiving data for said first memory section and before data for a second memory section is received; and
    circuitry operable to close the set of latches associated with said second memory section after receiving data for said second memory section.

8. The synchronous memory device of claim 7, wherein said write latch control circuit further comprises circuitry operable to successively close each respective set of latches after data for each associated memory section is received.

9. A method of writing data to a synchronous memory device, said method comprising the steps of:
    receiving address and control inputs, one of the control inputs comprising a system clock signal operating at a system clock frequency;
    in response to the address and control inputs, enabling predetermined rows in a plurality of memory sections;
    in response to the address and control inputs, synchronously enabling predetermined columns in each of the plurality of memory sections substantially simultaneously;
    at the system clock frequency, receiving input data groups to be written to the memory device, wherein said step of receiving comprises receiving the input data groups in a plurality of sets of latches, one each of the sets associated with a respective memory section; and
    writing the input data groups substantially simultaneously to the memory sections after data has been received for each of the memory sections.

10. The method of claim 9, further comprising the steps of:
    opening each of the sets of latches for the data to be written to a first memory section;
    closing the set of latches associated with the first memory section before data for a second memory section is received; and
    closing the set of latches associated with the second memory section after receiving data for the second memory section.

11. The method of claim 10, and further comprising the steps of successively closing each respective set of latches after data for each associated memory section is received.

12. A synchronous memory device for storing data, said memory device comprising:

a timing and control circuit operable to receive address and control inputs and to generate internal control signals, one of said control inputs comprising a system clock signal operating at a system clock frequency;

a memory bank including a plurality of memory sections, each of said memory sections including an array of memory cells arranged in rows and columns;

a row decoder coupled to said timing and control circuit and operable to enable rows in each of said memory sections;

a column decoder coupled to said timing and control circuit and operable to synchronously enable columns in each of said memory sections substantially simultaneously;

an input buffer coupled to said memory bank, said input buffer operable to receive data groups at said system clock frequency and to separately latch input data groups for each of said memory sections in synchronism with the system clock frequency; and a write mask circuit operable to mask the writing of data to predetermined memory sections in response to a mask control input, wherein said write mask circuit includes circuitry responsive to said mask control input and a section select signal, said section select signal indicating which memory section is to be masked, such that writing is prevented to the memory section to be masked upon assertion of said mask control input.

13. The synchronous memory of device of claim 12, wherein said memory bank comprises an array of dynamic random access memory cells.

14. The synchronous memory device of claim 12, wherein said memory bank includes two memory sections.

15. The synchronous memory device of claim 12, wherein said memory bank includes two memory sections, and wherein said section select signal, when active, toggles between said two memory sections at said system clock frequency.

16. A method of masking data to be written to a synchronous memory device, said method comprising the steps of:

receiving address and control inputs, one of the control inputs comprising a system clock signal operating at a system clock frequency;

in response to the address and control inputs, enabling predetermined rows in a plurality of memory sections;

in response to the address and control inputs, synchronously enabling predetermined columns in each of the plurality of memory sections substantially simultaneously;

at said system clock frequency, receiving input data groups to be written to the memory device, wherein said step of receiving comprises receiving the input data groups in a plurality of sets of latches, one each of the sets associated with a respective memory section; and writing the input data group substantially simultaneously to the unmasked memory sections after data has been received for each of the memory sections.

17. The method of claim 16, wherein said step of masking further comprises the steps of:

receiving a mask control signal synchronously with the data group to be masked;

selecting the memory section that corresponds to the address of the data group to be masked; and preventing the writing of data to the memory section that corresponds to the address of the data to be masked.

* * * * *

UNITED STATES PATENT AND TRADEMARK OFFICE
CERTIFICATE OF CORRECTION

PATENT NO. : 5,539,696
DATED      : July 23, 1996
INVENTOR(S): Vipul C. Patel

It is certified that error appears in the above-indentified patent and that said Letters Patent is hereby corrected as shown below:

On the title page, insert item [73],
 Name of Assignee:   Texas Instruments Incorporated Dallas, TX
                     USA Signed and Sealed this Eighteenth Day of February, 1997

Attest:

BRUCE LEHMAN

*Attesting Officer*            *Commissioner of Patents and Trademarks*